United States Patent [19]

King et al.

[11] Patent Number: 4,992,059
[45] Date of Patent: Feb. 12, 1991

[54] ULTRA FINE LINE CABLE AND A METHOD FOR FABRICATING THE SAME

[75] Inventors: David R. King, Catonsville; David B. Harris, Columbia, both of Md.

[73] Assignee: Westinghouse Electric Corp., Pittsburgh, Pa.

[21] Appl. No.: 445,292

[22] Filed: Dec. 1, 1989

[51] Int. Cl.$^5$ .............................................. H01R 9/07
[52] U.S. Cl. ..................................... 439/492; 439/77;
439/85; 174/117 FF; 29/848; 29/877
[58] Field of Search ................. 439/85, 55, 492–499,
439/67, 77; 174/117 F, 117 FF; 29/846–849,
830, 577 R; 156/656, 657, 630; 430/313;
204/15, 20

[56] References Cited

U.S. PATENT DOCUMENTS

| | | | |
|---|---|---|---|
| 3,387,359 | 6/1968 | Dale et al. | 29/577 |
| 3,577,633 | 5/1971 | Homma | 29/588 |
| 3,680,206 | 8/1972 | Roberts | 29/580 |
| 3,930,963 | 1/1976 | Polichette et al. | 204/15 |
| 4,075,757 | 2/1978 | Malm et al. | 29/847 |
| 4,565,606 | 1/1986 | Cassat | 204/20 |
| 4,566,940 | 1/1986 | Itsumi et al. | 156/656 |
| 4,604,160 | 8/1986 | Murakami et al. | 29/846 |
| 4,612,083 | 9/1986 | Yasumoto et al. | 156/656 |
| 4,619,887 | 10/1986 | Hooper et al. | 430/313 |
| 4,670,091 | 6/1987 | Thomas et al. | 156/657 |
| 4,681,654 | 7/1987 | Clementi et al. | 156/630 |
| 4,899,439 | 2/1990 | Potter et al. | 29/830 |
| 4,920,639 | 5/1990 | Yee | 29/846 |
| 4,921,054 | 5/1990 | Voss et al. | 29/846 |

*Primary Examiner*—David L. Pirlot
*Attorney, Agent, or Firm*—W. G. Sutcliff

[57] ABSTRACT

The invention is a fine line electrical cable with two ends having a plurality of first conductor lines in a plane. The lines of the cable are embedded in an insulating laminate material, are closely spaced at one end to be compatible with the closely spaced contacts from IC chips and are fanned out along the length of the cable to the other end where the lines are spaced somewhat apart and compatible with conventional electrical connectors. Contact posts extent from each line end so that external connections may be made with the IC chips and the conventional connectors. At least one second conductor line may be embedded within the other side of the laminate material and appropriate contact posts extend from the line ends so that external connections may also be made at these locations. A method for fabricating the fine line elecrical cable is also disclosed.

20 Claims, 7 Drawing Sheets

ULTRA FINE LINE CABLE AND A METHOD FOR FABRICATING THE SAME

FIELD OF THE INVENTION

This invention is directed to a cable which provides mating to electrical contacts associated with electronic interconnections to integrated circuit chips. More particularly this invention is directed to a cable having closely spaced fine lines and a method of fabrication for the same.

BACKGROUND OF THE INVENTION

The miniaturization of electronic circuitry such as that provided through integrated circuit chips has created a need for electrical connectors that are compatible with the closely spaced contacts of IC chips. One solution to this problem is through the use of devices known as IC chip carriers. An IC chip carrier is a housing into which a single chip is placed. Connections are made to the appropriate terminals of the IC chip and then fanned out to external contacts on the carrier at spaced distances which are more acceptable for mating with conventional circuitry. In this way a chip contained within an IC chip carrier has external connections on the carrier which may be connected to conventional circuitry.

However, with wafer scale integration technology, a plurality of IC chips may now be fabricated upon a common wafer such that chip carriers for individual chips are no longer feasible. It is possible for a wafer to contain at least fifteen separate IC chips and the external connections for these chips are closely spaced on the perimeter of the wafer. It would not be practical to put the entire wafer in a chip carrier and thereby expand the connections to be compatible with conventional connectors. A design is necessary that will act as an interface between the chips on a wafer and conventional connectors.

An object of this invention is to fabricate an ultra fine line cable capable of providing electrical connection between the IC chip connectors on a wafer to other external connections.

Another object of this invention is to fabricate an ultra fine line cable capable of providing electrical connection between the IC chip connectors on a wafer to the IC chip connectors of another wafer.

Another object of this invention is to develop a method to produce these ultra fine line cables in a manner that provides accuracy but at the same time may be fabricated efficiently and at a relatively low cost.

Still another object of this invention is to utilize the inherent accuracy of additive processes to deposit fine line circuits for the cables.

Still another object of this invention is to develop a fine line cable that has sufficient flexibility to alleviate the need for the exact alignment between components a rigid cable or connector would require.

SUMMARY OF THE INVENTION

A method is disclosed of fabricating an elongated cable having closely spaced lines for interconnecting spaced apart integrated circuits comprising a plurality of closely spaced elongated planar first conductor lines in a first plane insulatingly spaced from at least one elongated planar second circuit line with contact posts extruding from opposed ends of each of the first conductor lines and from opposed ends of the at least one planar second conductor line. The method comprises the steps of first fabricating a first cable panel by depositing upon a first layer of conductive material having two opposed ends a plurality of raised electrically conductive closely spaced elongated planar first conductor lines of a known length having first and second ends and also depositing upon the first base layer at least a pair of electrically conductive vertical connecting pillars extending above the planar first conductor lines, each of the pillars of a pair positioned near each opposed end of the first base layer and positioned beyond the ends of the first conductor lines. A second cable panel is fabricated by depositing at least one raised electrically conductive elongated planar second conductor line upon a second base layer of conductive material, the second conductor line being of a length at least equal to the distance between opposing pairs of vertical pillars of the first cable panel. The first cable panel and the second cable panel are laminated together with a thin flexible laminate insulating material being disposed therebetween with the vertical pillars extending through the laminate to electrically contact opposite ends of the second conductor line. Selected area of the first base layer of conductive material are then removed to expose the ends of the first conductor lines and the ends of the vertical pillars and to simultaneously provide the necessary electrical conduction for electrolytical deposition upon the first conductor line ends and the vertical pillar ends. Vertical contact posts of conductive material are then electrolytically deposited upon the exposed ends of the first conductor lines and the exposed ends of the pillars. The remaining portions of the first conductive base layer are then removed to electrically insulate the contact posts and the first conductor lines. The second conductive base layer is then removed. Finally a layer of electrical insulation is then disposed upon the exposed surfaces of the laminated first and second cable panels and permitting the contact posts to protrude through the layer to provide electrical access to the flexible cable.

Furthermore an elongated flexible cable fabricated utilizing the method above is disclosed and claimed.

BRIEF DESCRIPTION OF THE DRAWING

The above as well as other features and advantages of this device and method of fabrication will become apparent through consideration of the detailed descriptions in connection with the accompanying drawings in which.

DESCRIPTION OF THE PREFERRED EMBODIMENT

The invention described in the present application will enable fine line cables to be produced using an additive process. The lines will not be etched thereby greatly increasing the dimensional integrity of the lines and spaces. Using this process, the lines are provided with better stability during lamination.

Figure 1:
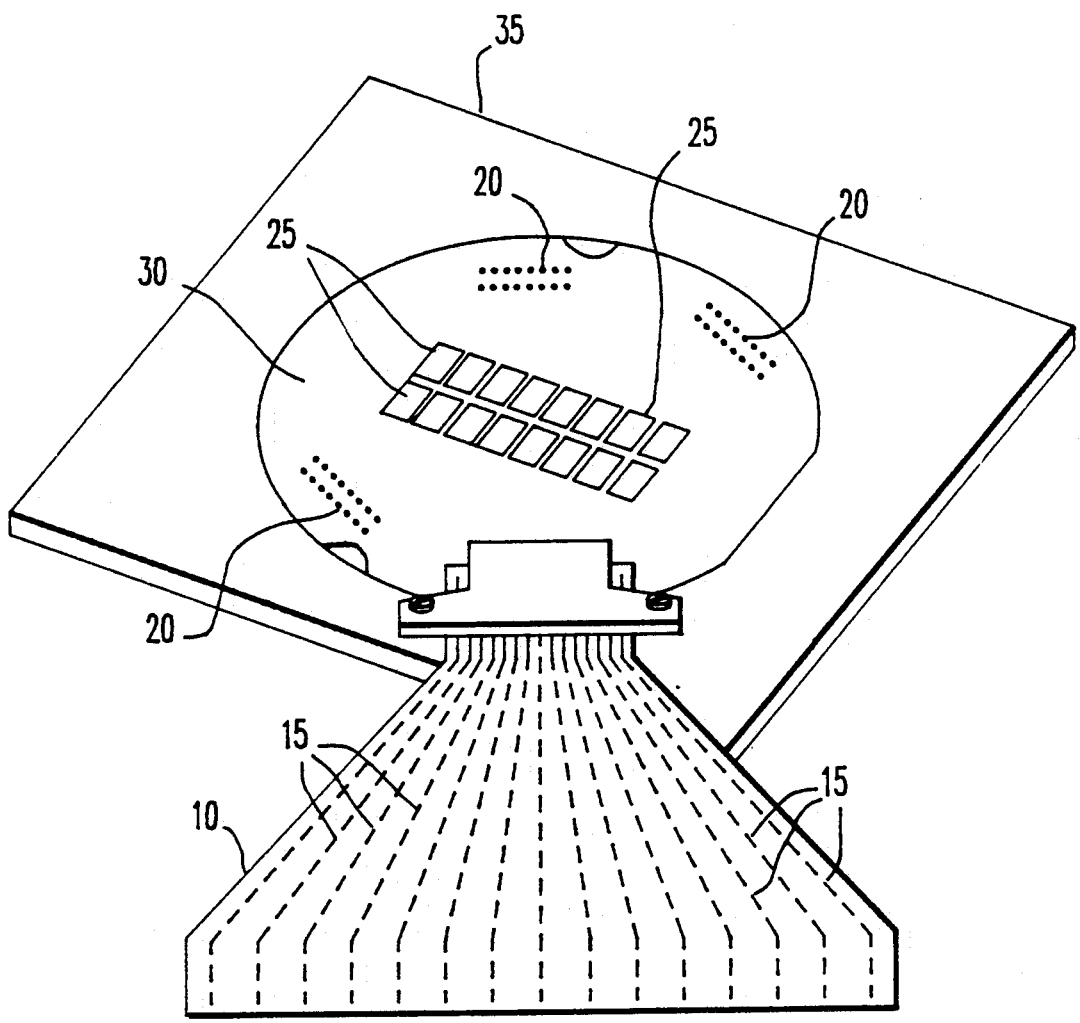
FIG. 1 illustrates a fine line cable in position and aligned with a plurality of external contacts situated upon a dielectric wafer upon which a plurality of integrated circuit chips have been fabricated and interconnected.

As an overview, FIG. 1 shows an ultra fine line cable 10 having a plurality of fine lines 15 electrically contacting a plurality of wafer connections, similar to connections 20, which are interconnected to a plurality of integrated circuit (IC) chips 25 fabricated upon a dielectric wafer 30. The cable 10 and the wafer 30 are both secured to a mounting plate 35. Through the use of the cable 10, the closely spaced wafer connections 20 may be fanned out such that conventional connecting techniques may be utilized at the other end of the cable 10. Note that while only a limited number of fine lines 15 are shown in FIG. 1, a single cable may have many more lines. The cable 10 connects to the wafer connection 20 through vertical contact posts (not shown).

Figure 2:
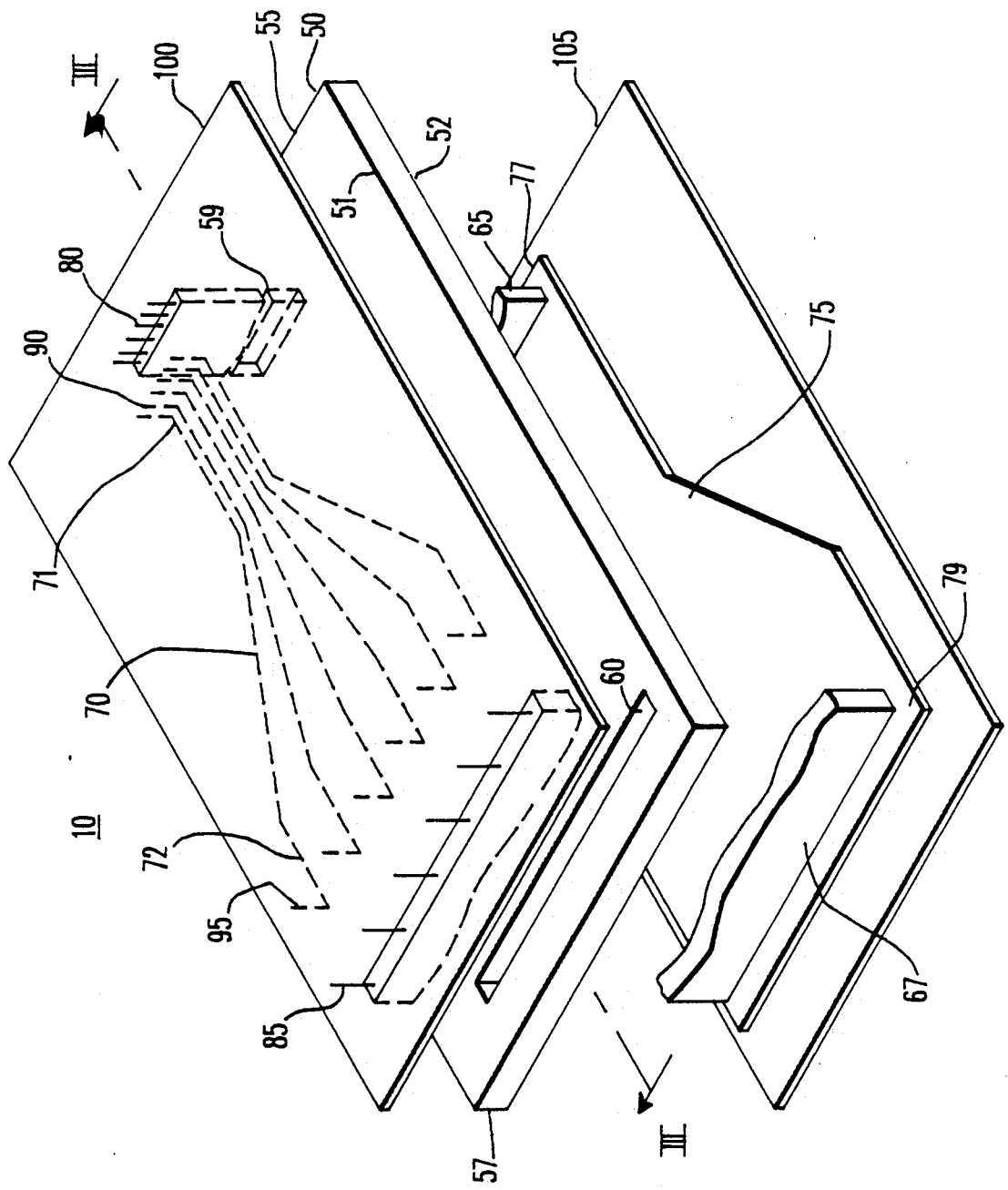
FIG. 2 shows an exploded view of one embodiment of the fine line cable.

Referring now more particularly to FIG. 2, an exploded view of one embodiment of the cable 10 is presented. The elongated cable 10 shown in FIG. 2 is inverted from that shown in FIG. 1 for clarification. A thin laminate electrically insulating material 50, which preferably is made of a flexible material, having a first side 51, a second side 52, a first end 55 and a second end 57 has approximately rectangular openings 59 and 60 to permit vertical connecting pillars 65 and 67 to pass therethrough. A plurality of first conductor lines 70, each with a first end 71 and a second end 72, are embedded within the first side 51 of the laminate material 50.

Distances between lines 70 at the region in which the lines are most closely spaced may be as close as 0.003 inches. The width of the lines may also be as small as 0.003 inches.

Laminating the two cable panels together such that the pillars contact the associated conductive lines on the other cable panel avoids the problem of plated through holes that would be required if pillars were to be deposited directly through the insulating laminate material. The laminate insulating material may be a material providing electrical insulation such as polyimide, polyetherimide, an epoxy fiberglass composition or a polyetherimide fiberglass composition.

A second conductor line 75 having a first end 77 and a second end 79 is embedded within the second side 52 of the laminate insulating material 50. The vertical connecting pillar 65 extends from the first end 77 of the second conductor line 75 through the opening 59 in the insulating material 50 to a level approximately flush with that of the first side 51 of the insulating material 50. The other vertical connecting pillar 67 extends from the second end 79 of the second conductor line 75 through the opening 60 in the insulating material 50 to a level also flush with the first side 51 of the insulating material 50. Sets of vertical contact posts 80 and 85 extend from vertical connecting pillar 65 and vertical connecting pillar 67 respectively.

Contact posts 90 and 95 extend from each of the first ends 71 of the first conductor line 70 and each of the second ends 72 of the conductor lines 70 respectively. The insulating material 50 with the circuitry embedded therein is encompassed between a first electrical insulation sheet 100 and a second electrical insulation sheet 105 with the contact posts 80, 85, 90 and 95 extending vertically therefrom. It is the two sets of contact posts 80 and 90 which, when the cable 10 is inverted, align with the wafer connections 20 seen in FIG. 1 to provide electrical contact with the wafer 30.

Figure 3:
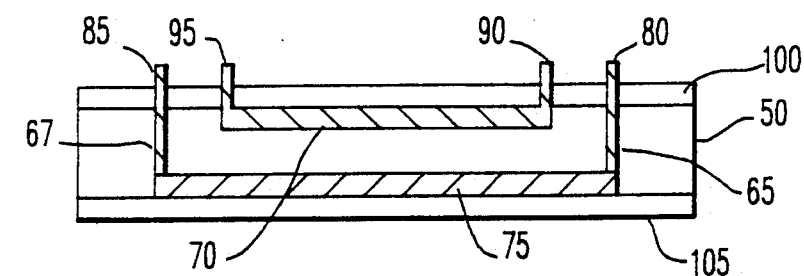
FIG. 3 shows a cross-section of the fine line cable illustrated in FIG. 2.
Figure 5:
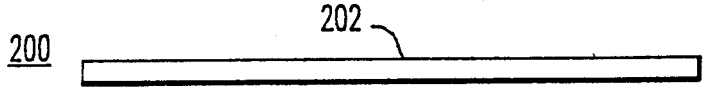
FIGS. 5 through 8 illustrate, sequentially, the steps for fabricating one of the cable panels for the fine line cable.

FIG. 3 shows a cross section through the center of FIG. 2 and the item numbers correspond to those in FIG. 2. FIG. 3 is identical to FIG. 23 and is the result of a series of steps which will be described in FIG. 5 through 23.

Figure 4:
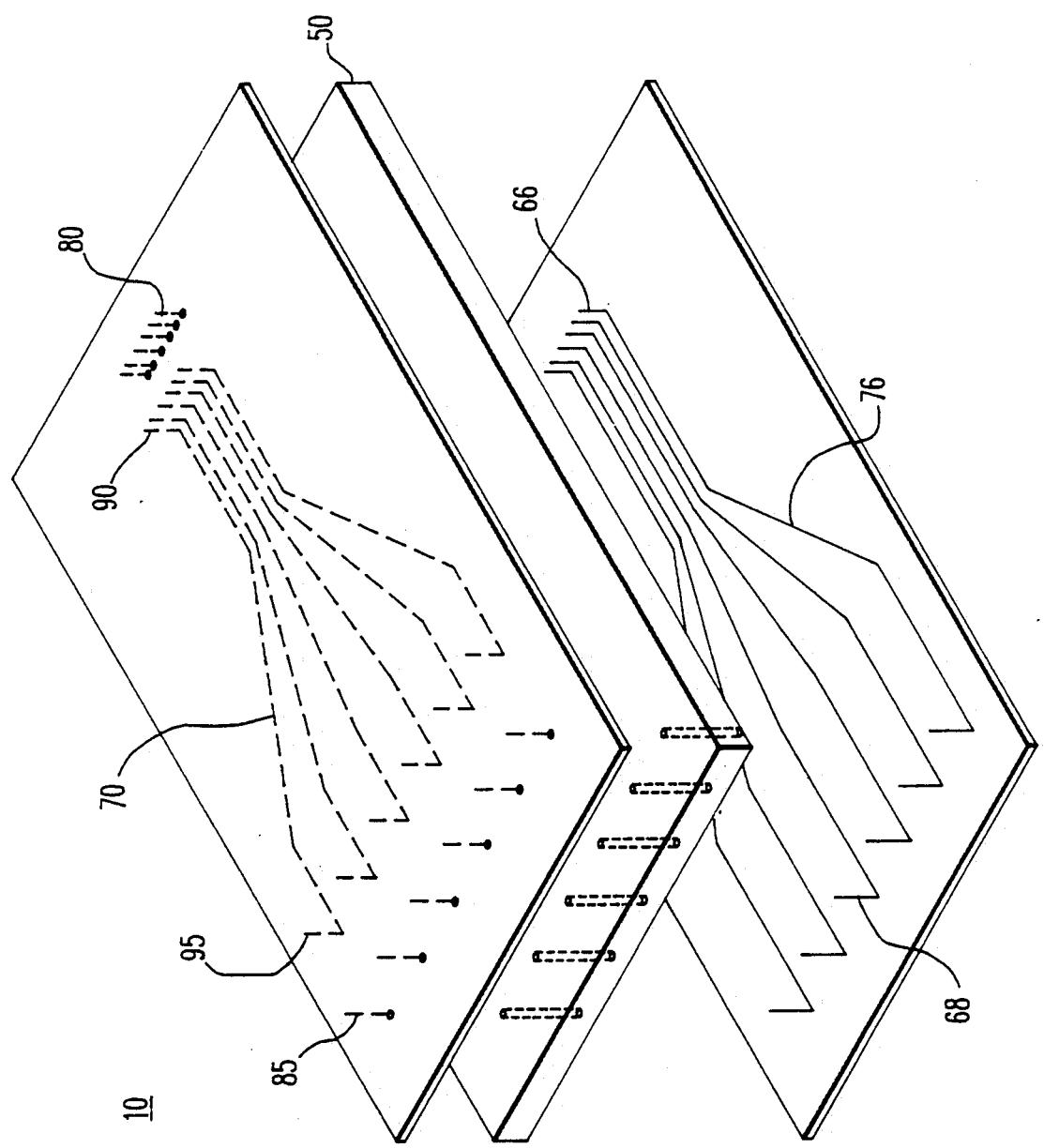
FIG. 4 shows an exploded view of a second embodiment of the cable.

FIG. 4 shows another embodiment of the elongated cable 10. This embodiment differs from that shown in FIG. 2 in that the second conductor line 75 in FIG. 2, rather than being of a singular planar solid configuration, is a plurality of individual second conductor lines 76. Just as in FIG. 2, these conductor lines are also embedded within the thin laminate insulating material 50. Furthermore, rather than singular vertical connecting pillars 65 and 67 of FIG. 2, a plurality of vertical connecting pillars 66 and 68 are located at opposite ends of the conductor lines 76. A plurality of first conductor lines 70 is still embedded in the insulating material 50 and contact posts 90 and 95 still extend vertically from each end of the first conductor lines 70. However, the contact posts 80 and 85 now extend from individual vertical connecting pillars 66 and 68 respectively. For simplicity fabrication of the cable in FIGS. 2 and 3 will be described first and then the cable in FIG. 4 will be addressed.

Figure 6:
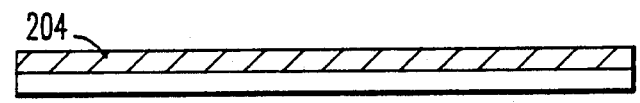

The fabrication of the cable 10 (FIG. 2) requires the bonding of a first cable panel to a second cable using an insulating lamination material disposed therebetween. FIGS. 5 through 8 show the initial steps for the fabrication of a first cable panel 200 as shown in FIG. 8. The fabrication of panel 200 begins with a temporary substrate 202 (FIG. 5) made of a material such as reusable type 304 stainless steel plate with a 2B finish. The plate 202 would typically be 0.075 inches thick and be mechanically and chemically cleaned. In a preferred embodiment, the first step in the manufacture of the first panel 200 is to deposit, by a process such as electroplating, a uniformly thin first base layer 204 of a conductive material such as copper on the substrate 202 so as to form a layer of approximately 0.0004 inches of copper over the entire substrate 202 as seen in FIG. 6. The copper layer 204 serves as a base layer upon which further deposition of conductor lines may be applied, and also serves as a releasing material for separating the lines from the stainless steel substrate 202 after formation of the panel 200 is complete.

Note that in lieu of a substrate plated with a base layer of metal, a thin plate of metal such as copper may be used. If this were the case then rather than separating the base layer from any material deposited upon it, the entire plate may be mechanically or chemically removed.

Also, in lieu of a substrate plated with a base layer of metal, it is possible to secure a thin layer of metal foil upon the substrate rather than electrolytically depositing a layer upon the substrate. The foil may be mechanically secured or chemically bonded to the substrate. To separate the foil, the foil would be mechanically released or the chemical bond dissolved or broken.

Using a substrate 202 plated with a base layer 204 of metal, the base layer 204 is then coated with a photosensitive resist layer, the resist layer is masked to a desired pattern and the resist layer is exposed to ultraviolet light thereby developing the exposed resist. The desired pattern is a pattern resembling the first conductor lines 70 and the vertical connecting pillars 65 and 67 shown in FIG. 2. The exposed resist is removed thereby exposing portions of the copper layer 204. The exposed portions of layer 204 are now used as a base for deposition of a first planar conductive pattern 215 upon the exposed portions of the first base layer 204 of conductive material as in FIG. 7. The first planar conductive pattern 215 which has been deposited upon the second base layer 204 comprises the first conductor lines 70 and a portion 217 of vertical connecting pillar 65 (FIG. 2) and a portion 219 of vertical connecting pillar 67 (FIG. 2). A preferred technique for the deposition of the first planar conductive pattern 215 is through the electrolytical deposition process of electroplating.

The use of photosensitive resist and selective exposure of the resist to define a pattern upon a conductive surface on which to deposit a metal are well known in the art and will not be discussed in detail. Note that the conductor lines are deposited in an additive manner and that no metal is etched or removed to form the conductor lines. This permits better dimensional stability of the conductor lines and also permits the fabrication of smaller lines than if subtractive processes were used.

Figure 7:
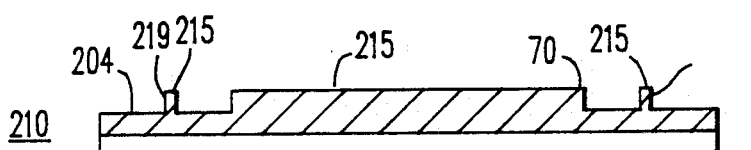
Figure 8:
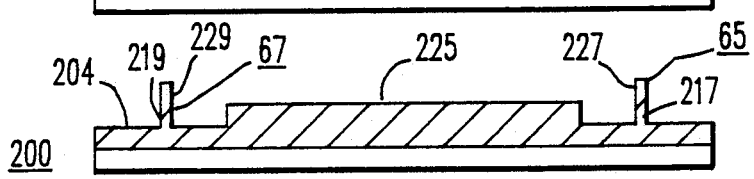

Once this deposition step has been completed, the vertical connecting pillar portions 217 and 219 of FIG. 7 must be further built up because it is these portions which make up pillars 56 and 67 in FIG. 2 and which must extend downward through the laminating insulating material (50 of FIG. 2) to electrically contact the circuitry of the second cable panel. Again a layer of photoresist is used but this time the resist covers the first planar conductive pattern 215, which includes the vertical connecting pillar portions 217 and 219, the circuit lines 70 and the exposed portions of the second base layer 204. The photoresist is masked such that only the portion of the photoresist above the vertical connecting pillar portions 217 and 219 will be exposed. Second portions 227 and 229 may have smaller cross sections than portions 217 and 219 so that registration for deposition of the portions 227 and 229 over the portions 217 and 219 may be made easier. The photoresist is then selectively exposed and removed such that the ends of pillar portions 217 and 219 are exposed. A second planar conductive pattern 225 is now deposited, preferable through an electrolytical deposition process such as electroplating, so that second portions 227 and 229 are now deposited as in FIG. 8 to complete the vertical connecting pillars 65 and 67. Again the process of metal deposition is an additive one. This completes the fabrication of the first cable panel 200.

Figure 9:
FIGS. 9 through 11 illustrate, sequentially, the steps for fabricating the other cable panel of the fine line cable.
Figure 10:
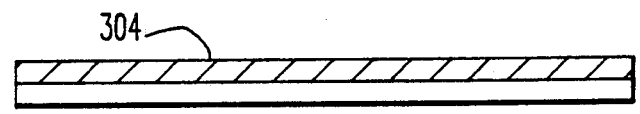
Figure 11:
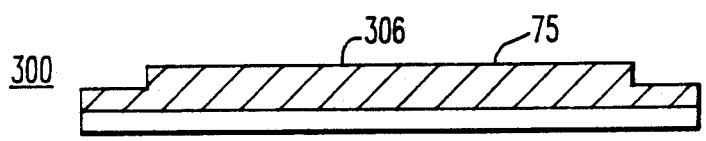

The fabrication of a second cable panel 300 (FIG. 11) is illustrated in FIGS. 9 through 11. Note the use of the additive process for line deposition. The fabrication of this panel begins with a temporary substrate 302 (FIG. 9) made of a material such as reusable type 304 stainless steel plate with a 2B finish. The plate 302 would typically be 0.075 inches thick and be mechanically and chemically cleaned. The first step in the manufacture of the second panel 300 is to deposit, by an electrolytical process such as electroplating, a uniformly thin second base layer 304 of a conductive material such as copper on the substrate 302 so as to form a layer of approximately 0.004 inches of copper over the entire substrate 302 (FIG. 10). The copper layer 304 serves as a base layer upon which further deposition of conductor lines may be applied, and also serves as a releasing material for separating the printed circuitry from the stainless steel substrate 302 after formation of the second cable panel 300 is complete.

Note again that in lieu of a substrate plated with a base layer of metal, a thin plate of metal, such as copper, may be used. If this were the case then rather than separating the base layer from any material deposited upon it, the entire plate may be mechanically or chemically removed. Also, it is possible to secure a thin layer of metal foil upon the substrate rather than electrolytically depositing a layer upon the substrate. The foil may be mechanically secured or chemically bonded to the substrate. To separate the foil, the foil would be mechanically released or the chemical bond dissolved or broken.

The base layer 304 which is deposited upon the substrate 304 is then coated with a photosensitive resist layer and masked with a photomask. The pattern of the photomask will resemble that of the second circuit line 75 of FIG. 2. The photoresist is exposed to light and then developed so that select portions of the base layer 304 are exposed in a pattern similar to that of the circuitry to be deposited. A conductive metal is then deposited upon the exposed portions of the base layer 304 utilizing an electrolytical deposition process such as electroplating to form a third planar conductive pattern 306 upon the second base layer 304 as shown in FIG. 11. The third planar conductive pattern 306 comprises the second conductor line 75 as shown in FIG. 2. As previously mentioned, the deposition of photoresist, the masking, the exposure and the removal of photoresist at selected portions to permit deposition of metal upon certain areas of a base layer are well known in the art and will not be discussed in detail here. Furthermore, the deposition process is an additive one and as such no metal is etched or removed to form the conductor lines. This permits better dimensional stability of the conductor lines and also permits the fabrication of smaller lines than if subtractive processes were used.

At this point the first cable panel 200 as shown in FIG. 8 and the second cable panel 300 as shown in FIG. 11 have been fabricated. Note in FIG. 8 the vertical connecting pillars 65 and 67, which each are comprised of two portions 217, 219 and 219, 229 respectively, extend above the first planar conductive pattern 215 (FIG. 7). This is important because these pillars act as connecting members between the first cable panel 200 and the second cable panel 300.

Figure 12:
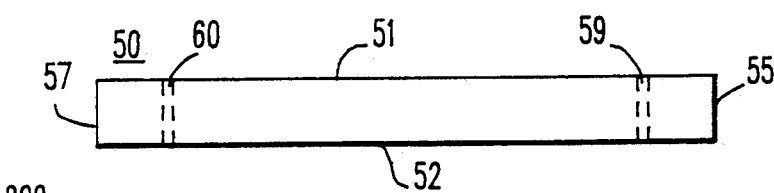
FIG. 12 illustrates a layer of laminate insulating material used for insulation between the two cable panels.

FIG. 12 shows the laminate insulating material 50 having a first side 51 and a second side 52 and a first end 55 and a second end 57 along with openings 59 and 60 extending through the laminate insulating material 50. A preferred thickness of the insulating material is about 0.004 inches. The opening in the material 50 may be made by drilling holes through the material or other means. However it is only necessary to provide openings that act as clearance holes for the pillars and therefore the holes may be oversized. The amount of oversizing is related to the amount of material which flows during lamination. It is preferable for the material to be flexible so that the cable is flexible. To form the cable shown in FIG. 2 it is necessary to laminate the first cable panel 200, using the laminate insulating material 50, to the second cable panel 300.

Figure 13:
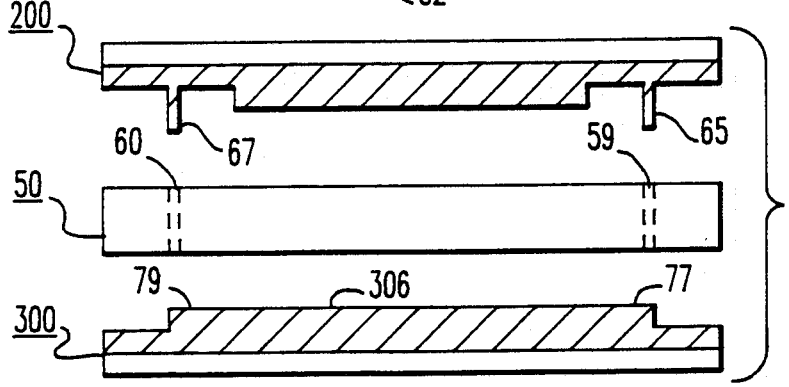
FIG. 13 illustrates the relationship between the two cable panels and the laminate insulating material.

As shown in FIG. 13, the first cable panel 200 is aligned with the laminate insulating material 50 such that the vertical connecting pillars 65 and 67 are aligned with the holes 59 and 60 respectively through the material 50. Aligned with the first cable panel 200 is the second cable panel 300 such that the vertical connecting pillars 65 and 67 of the first cable panel are aligned with the first end 77 and the second end 79 respectively of the third planar conductive pattern 306. The third planar conductive pattern 306 is the circuit line 75 of FIG. 2.

Figure 14:
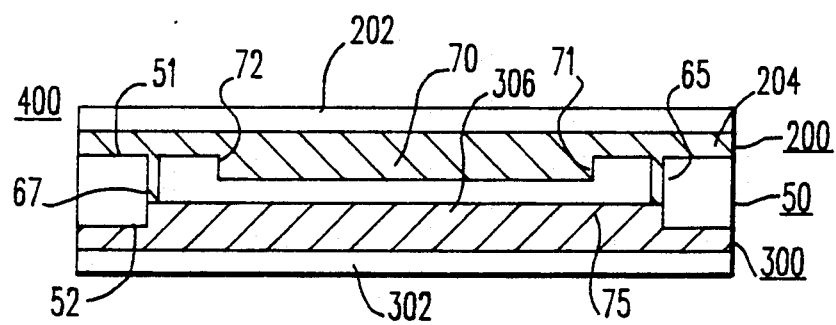
FIGS. 14 through 16 illustrate intermediate fabrication steps necessary to prepare the cable for the addition of contact posts.

As shown in FIG. 14, this structure of panels 200 and 300 and laminate material 50 is laminated together to form a unitary structure 400. Preferably the lamination of the first cable panel 200, the second cable panel 300 and the insulating material 50 is performed using a thermocompression process. Using this process all three elements 200, 50 and 300 are heated to a specified temperature and compressed to form the unitary structure 400. During this process, the first conductor lines 70 are embedded within the first side 51 of the laminating material 50 and the second conductor line 75 is embedded within the second side 52 of the laminate material 50. Furthermore, under compression the material 50 conforms to the first and second cable panels 200 and 300 such that the material around the holes 54 and 60 (FIG. 12) in the laminate material through which the vertical contact pillars 65 and 67 are inserted is compressed around these pillars and, aside from the pillar portion contacting the third planar conductor pattern 306, the pillars are fully enclosed by the insulating material 50.

At this point, the contact posts 80, 85, 90 and 95 as shown in FIG. 2 must be added to the unitary structure 400 shown in FIG. 14. To do this portions of the first base layer 204 must be removed and the contact posts must be electrolytically deposited in the locations of the first end 71 and second end 72 of the first conductor lines 70 and upon the vertical connecting pillars 65 and 67.

For the electrolytical deposition process to be possible it is necessary for all of the surfaces receiving a deposition to be electrically connected such that a single terminal may contact the surfaces and provide the necessary electrical potential at these surfaces. For this reason only portions of the first base layer 204 are removed, thereby providing an electrical short across all of the these surfaces. Prior to this deposition the substrate 202 must be removed.

Figure 15:
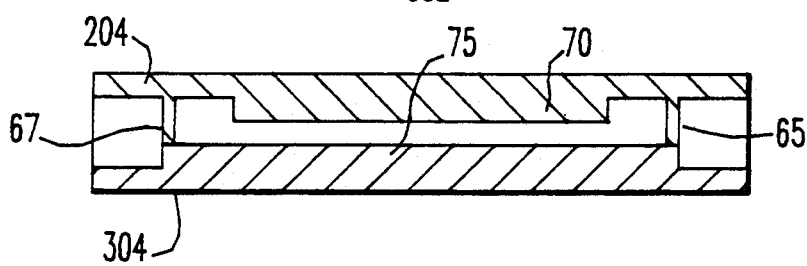

For convenience, at the same time, substrate 302 should be removed although this step may be performed later. Since, in the preferred embodiment, the conductor lines were deposited upon a substrate of a different metal, the substrates 202 and 302 may be carefully peeled away from the respective conductive base layers 204 and 304 to expose the layers as shown in FIG. 15. FIG. 15 illustrates a structure enclosed by the first base layer 204 and the second base layer 304 with the first conductor lines 70, the vertical connecting pillars 65 and 67 and the second conductor line 75 disposed therebetween. It is now necessary to deposit contact posts 80, 85, 90 and 95 as shown in FIGS. 2 and 3 in their respective positions.

Selected portions of the first base layer 204 must be removed so that the first ends 71 and the second ends 72 of the first conductor lines 70 are exposed and the ends of the vertical contact pillars 65 and 67 are exposed. Portions of the second base layer 204 must be removed to form cavities 400 and 405 (FIG. 16) to accomplish this result.

Figure 16:
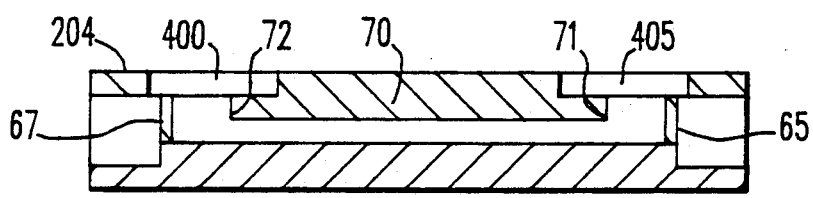
Figure 17:
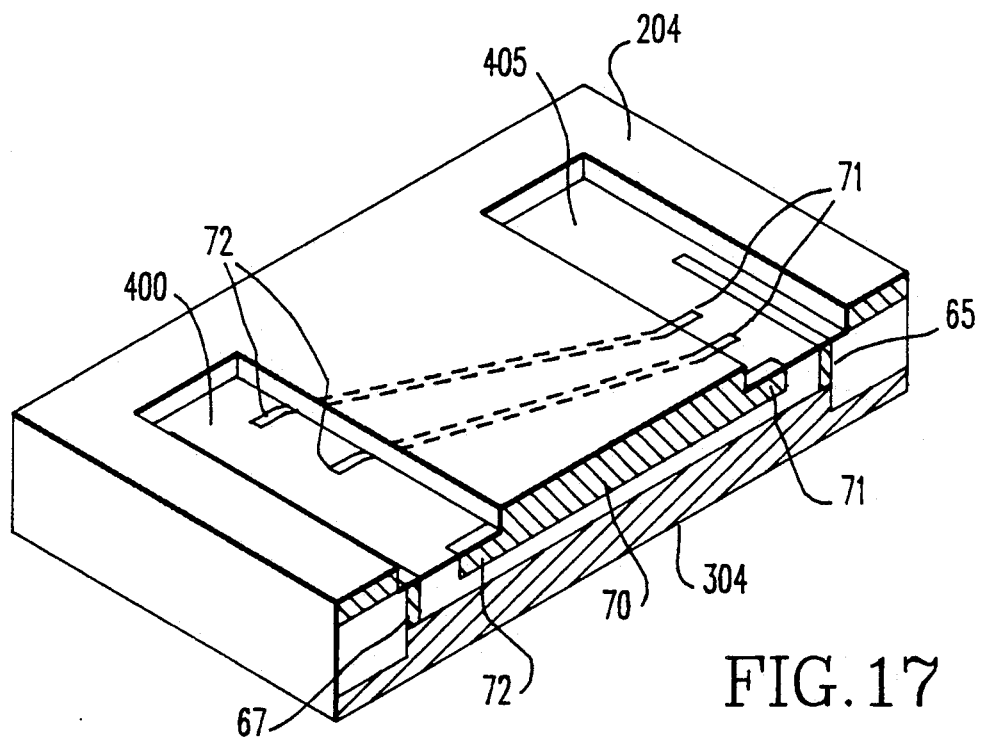
FIG. 17 illustrates an isometric view of FIG. 16 which is associated with the embodiment of FIG. 2.

As before a method by which photosensitive resist is deposited, selectively exposed to light and removed to form cavities within the resist may be used. The exposed surfaces within the cavities 400 and 405 are then subjected to an etchant for a specified time to remove the second base layer 204 at selected portions as seen in FIG. 16. FIG. 17 shows an isometric view of the configuration of FIG. 16.

It is important to note that the entire first base layer 204 has not been removed. The contact posts 80, 85, 90 and 95 are to be electrolytically deposited upon the ends of the first conductor lines 70 and the vertical contact pillars 65 and 67 as shown in FIGS. 2 and 3. Preferably, these contact posts will be deposited through the process of electroplating. In order for electrolytical deposition to be successful, it is necessary for every location upon which electroplating will occur to be electrically interconnected. To this end, the first base layer 204 (FIG. 17) with openings 400, 405 electrically connects all of the first conductor lines 71. Furthermore, the second base layer 304 is electrically connected to the vertical contact pillars 65 and 67. Because of this, a common clamp may be used to interconnect first base layer 204 with second base layer 304 thereby permitting the entire structure shown in FIG. 16 and FIG. 17 to be at the same electrical potential to permit electroplating.

Figure 18:
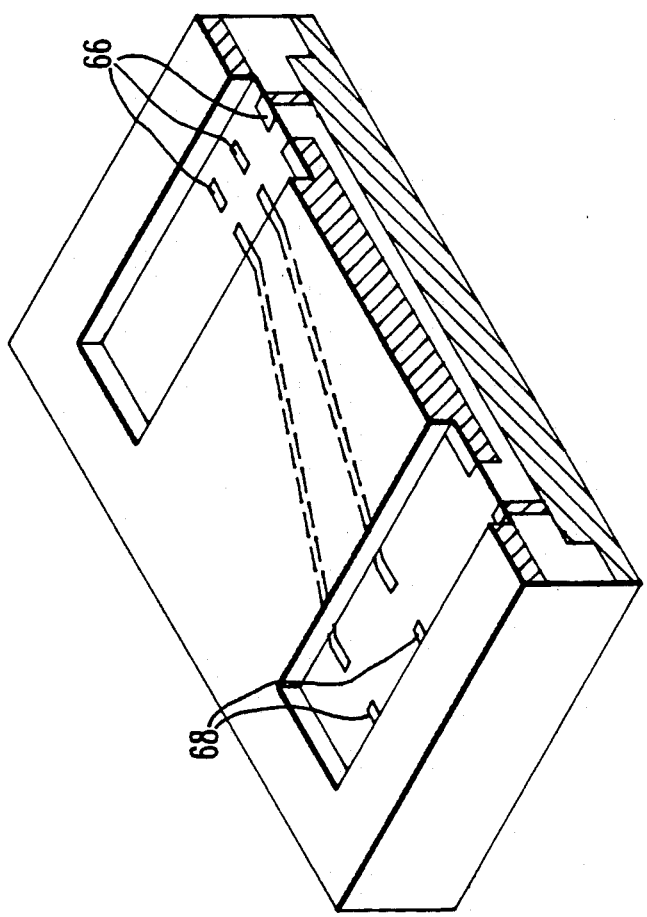
FIG. 18 is an isometric view of FIG. 16 which is associated with the embodiment of the cable shown in FIG. 4.

FIG. 18 is an isometric similar to that in FIG. 17 but is representative of the fabrication process for the cable shown in FIG. 4. The FIG. 18 details will be explained shortly.

Figure 19:
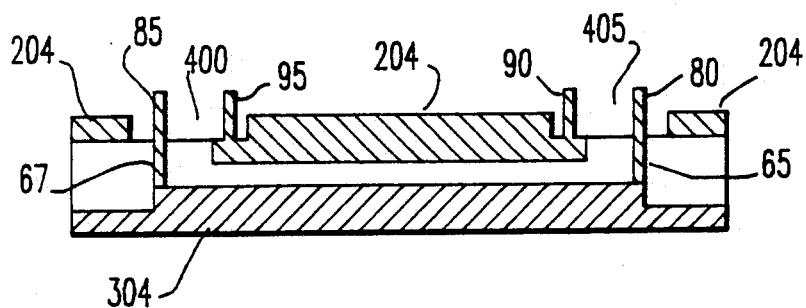
FIGS. 19 through 22 illustrate the steps necessary for the attachment of contact posts to the cable.

From FIGS. 16 and 17, in order to electrolytically deposit the contact posts 80, 85, 90 and 95, it is again necessary to utilize photoresist. A layer of photoresist is deposited within each opening 400 and 405 (FIGS. 16 and 17) to cover the first conductor line ends 71 and 72 and the vertical contact pillar 65 and 67 ends. The photoresist is then masked, exposed and selectively removed such that only the area directly above the ends 71 and 72 of the first circuit lines 70 and the vertical connecting pillars 65 and 67 are exposed. Vertical contact posts 80, 85, 90 and 95 may now be deposited as shown in FIG. 19. Note that individual contact posts 80 and 85 are deposited upon single pillars 65 and 67. These individual posts accommodate the connections available on the wafer (as shown in FIG. 1) or any other configuration that may be available. While what has been described is deposition of contact posts upon the pillars, it is possible to merely extend the pillars and use each pillar as an electrical connection point. It is possible to extend the length of the pair of pillars 65 and 67 such that the pillars extend to the level at which the contact posts 80 and 85 extend and have the pillars replace the posts entirely.

Figure 20:
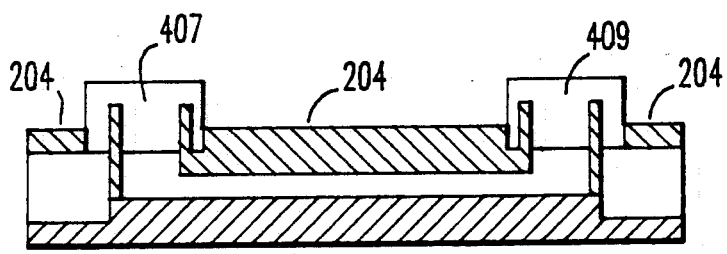
Figure 21:
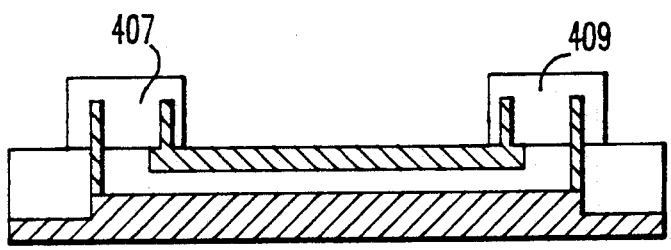
Figure 22:
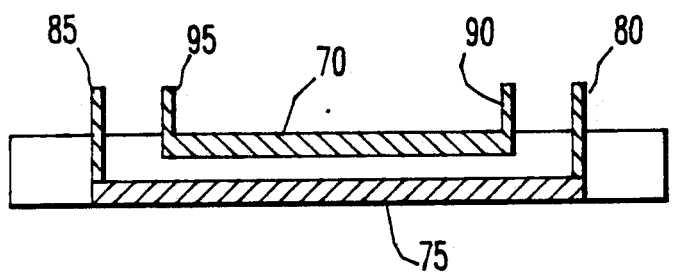

At this point, the elongated cable 10 is essentially complete. However, the remainder of the first base layer 204 and the entire second base layer 304 must be removed. While the removal of the second base layer 304 may be accomplished through a fairly straight forward techniques such as chemical etching, removal of the first base layer 204 is now complicated by the introduction of the newly deposited contact posts 80, 85, 90 and 95. For this reason as shown in FIG. 20, the openings 400 and 405 which were previously created in the first base layer 204 are now, along with the contact posts, covered with deposits 407 and 409 of a protective coating. With the coating in place, the remaining first base layer 204 is removed through a process such as etching as shown in FIG. 21. The remaining amounts 407 and 409 of the protective coating are then removed and the second base layer 304 is removed preferably through a method such as etching, thereby resulting in FIG. 22. It is also possible to remove base layer 304 at the same time as layer 204 is removed.

Figure 23:
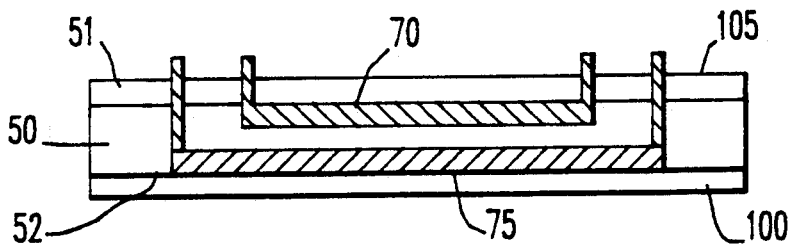
FIG. 23 illustrates the step of insulating both sides of the cable so that the cable is ready to use.

At this point, however, the first conductor lines 70 and the second conductor lines 75 along with the contact posts 80, 85, 90 and 95 are entirely exposed. For this reason, two insulating cover layers 100 and 105 are placed over the second conductor line 75 and the second surface 52 of the laminate and over the first conductor lines 70 and the first side of the laminate material 50 respectively. The contact posts 80, 85, 90 and 95 extend into and through the surface of the insulating cover layer 105 thereby providing contact points for external connections. Note that FIG. 23 is identical to FIG. 3 and each of these is representative of the elongated cable 10 found in each of FIGS. 2 and 3.

While the steps just described provide fabrication for the cable shown in FIG. 2, 3 and 17, another embodiment of the cable is shown in FIGS. 4 and 18. The fabrication steps are similar as are the materials used. The line thickness and spacing is also the same. The differences between the two cables are seen in the second conductor line 75 in FIG. 2 and the second conductor lines 76 in FIG. 4. While the conductor line 75, as a singular plane, may be utilized as a ground plane or for a single signal, the conductor lines 76 may be used for many signals.

However, with a plurality of second conductor lines 76, the pillars 65 and 67 of FIG. 2 are no longer acceptable and individual connecting pillars 66 and 67 must extend from each of the second conductor lines 76. Because of this the fabrication steps for the cable in FIG. 4 are slightly modified.

As mentioned, a plurality of second conductor lines 76 is deposited and as such the photomask described with FIG. 11 will resemble that of the second conductor lines 76 pattern. Furthermore, since these are individual lines 76, then there must be a pair of individual connecting pillars for each of the lines 76. For that reason the deposition described for FIG. 7 and FIG. 8 must provide individual pillars as shown in FIG. 4 items 66 and 68. The photomask must be patterned so that when exposed to light and portions of the photoresist removed, the newly created cavities will provide a pattern onto which these individual pillars may be deposited.

FIG. 18, which is similar to FIG. 17 except for the modifications discussed above, illustrates a cross-section isometric of the cable when fabricated with a plurality of connecting pillars 66 and 68. Aside from the differences discussed, the fabrication of the cable shown in FIG. 4 is similar to the fabrication of the cable shown in FIG. 2.

The description of this invention is intended to be merely exemplary and not circumscriptive of the invention as it is claimed below. The invention, thus, may be modified by those skilled in the art and yet be within the scope of such claims.

We claim:

1. A method of fabricating an elongated cable having closely spaced lines for interconnecting spaced apart integrated circuits comprising a plurality of closely spaced elongated planar first conductor lines in a first plane insulatingly spaced from at least one elongated planar second circuit line with contact posts extruding from opposed ends of each of the first conductor lines and from opposed ends of the at least one planar second conductor line, which method comprises the steps of:

(a) fabricating a first cable panel by depositing upon a first layer of conductive material having two opposed ends a plurality of raised electrically conductive closely spaced elongated planar first conductor lines of a known length having first and second ends and also depositing upon the first base layer at least a pair of electrically conductive vertical connecting pillars extending above the planar first conductor lines, each of the pillars of a pair positioned near each opposed end of the first base layer and positioned beyond the ends of the first conductor lines;

(b) fabricating a second cable panel by depositing at least one raised electrically conductive elongated planar second conductor line upon a second base layer of conductive material, the second conductor line being of a length at least equal to the distance between opposing pairs of vertical pillars of the first cable panel;

(c) laminating the first cable panel to the second cable panel with a thin flexible laminate insulating material being disposed therebetween with the vertical pillars extending through the laminate to electrically contact opposite ends of the second conductor line;

(d) removing selected areas of the first base layer of conductive material to expose the ends of the first conductor lines and the ends of the vertical pillars and to simultaneously provide the necessary electrical conduction for electrolytical deposition upon the first conductor line ends and the vertical pillar ends;

(e) electrolytically depositing vertical contact posts of conductive material upon the exposed ends of the first conductor lines and the exposed ends of the pillars;

(f) removing the remaining portion of the first conductive base layer to electrically insulate the contact posts and the first conductor lines;

(g) removing the second conductive base layer;

(h) disposing a layer of electrical insulation upon the exposed surfaces of the laminated first and second cable panels and permitting the contact posts to protrude through the layer to provide electrical access to the flexible cable.

2. The method according to claim 1 wherein the step of laminating the first cable panel to the second cable panel with a laminate insulating material comprises laminating with a flexible insulating material.

3. The method according to claim 1 wherein the step of laminating the first cable panel to the second cable panel is performed using a thermocompression process.

4. The method according to claim 1 wherein the step of fabricating a first cable panel by providing a plurality of first conductor lines and by providing electrically conductive vertical pillars comprises forming a first planar conductive pattern of first conductor lines and vertical pillars and then forming a second planar conductive pattern above the first planar conductive pattern upon and integrally bonding to only the vertical pillars such that the vertical pillars are layered, and extend above the first planar conductive pattern.

5. The method according to claim 4 wherein the step of fabricating a second cable panel by depositing at least one second conductor line comprises forming a single third planar conductive pattern above the second base layer of conductive material.

6. The method according to claim 5 wherein the steps of forming a first planar conductive pattern and a third planar conductive pattern are performed by:
   (i) depositing photosensitive resist onto each base layer of conductive material;
   (ii) masking the photosensitive resist with a photomask which defines the conductive pattern to be deposited upon the base layer;
   (iii) exposing the masked photosensitive resist to light;
   (iv) dissolving those portions of the resist corresponding to the desired conductive pattern to form three-dimensional cavities in the resist to expose the respective base layer; and
   (v) electrolytically forming a layer of conductive material upon the exposed portions of the respective base layer to form a raised conductive pattern above the general plane of the base layer and conforming to the three-dimensional cavity definition of the respective photosensitive resist image.

7. The method according to claim 6 wherein the steps of forming a second planar conductive pattern to extend the connecting pillars is performed by:
   (i) depositing photosensitive resist onto the raised second conductive pattern and the exposed first base layer;
   (ii) masking the photosensitive resist with a photomask which defines the third conductive pattern to be deposited;
   (iii) exposing the masked photosensitive resist to light;
   (iv) dissolving those portions of the resist corresponding to the desired conductive pattern to form three-dimensional cavities in the resist to expose the respective base layer; and
   (v) electrolytically forming a layer of conductive material upon the exposed portions of the respective base layer to form a raised conductive pattern above the general plane of the base layer and conforming to the three-dimensional cavity definition of the respective photosensitive resist image.

8. The method according to claim 4 wherein the step of fabricating a second cable panel by depositing at least one second conductor line comprises forming a single solid plane of conductive material upon the second base layer.

9. The method according to claim 8 wherein
   (i) the step of forming a single solid plane of conductive material is comprised of forming a single solid plane of conductive having a thickness of less than 0.004 inches,
   (ii) the step of fabricating a first cable panel is comprised of depositing first conductor lines having a thickness of less than 0.004 inches and spaced from each other by a distance between 0.004 and 0.008 inches and
   (iii) the step of laminating is comprised of laminating with a laminate insulating material having a thickness of approximately 0.008 inches.

10. The method according to claim 4 wherein the step of fabricating a second cable panel by depositing at least one second conductor line comprises forming a plurality of closely spaced elongated second conductor lines.

11. The method according to claim 10 wherein
   (i) the step of fabricating a second cable panel by forming a plurality of closely spaced elongated conductor lines comprises forming lines having a thickness of less than 0.004 inches and separated from one another by a distance of between 0.004 and 0.008 inches,
   (ii) the step of fabricating a first cable panel is comprised of depositing first conductor lines having a thickness of less than 0.004 inches and spaced from each other by a distance between 0.004 and 0.008 inches and
   (iii) the step of laminating is comprised of laminating with a laminate insulating material having a thickness of approximately 0.008 inches.

12. A method of fabricating a flexible elongated cable having closely spaced lines for interconnecting spaced apart integrated circuits comprising a plurality of closely spaced elongated planar first conductor lines in a first plane insulatingly spaced from at least one elongated planar second circuit line with contact posts extruding from opposed ends of each of the first conductor lines and from opposed ends of the at least one planar second conductor line, which method comprises the steps of:
   (a) fabricating a first cable panel by depositing by electroplating upon a first base layer of conductive material having two opposed ends a plurality of raised electrically conductive closely spaced elongated planar first conductor lines of a known length having first and second ends and also electroplating upon the first base layer at least a pair of electrically conductive vertical connecting pillars extending above the planar first conductor lines, each of the pillars of a pair positioned near each opposed end of the first base layer and positioned beyond the ends of the first conductor lines;
   (b) fabricating a second cable panel by electroplating at least one raised electrically conductive elongated planar second conductor line upon a second base layer of conductive material, the second conductor line being of a length at least equal to the distance between opposing pairs of vertical pillars of the first cable panel;
   (c) laminating by thermocompression the first cable panel to the second cable panel with a thin flexible laminate insulating material being disposed therebetween with the vertical pillars extending through the laminate to electrically contact opposite ends of the second conductor line;
   (d) removing selected areas of the first base layer of conductive material to expose the ends of the first conductor lines and the ends of the vertical pillars;
   (e) electroplating and integrally bonding vertical contact posts of conductive material upon the exposed ends of the first conductor lines and the exposed ends of the pillars;
   (f) removing the remaining portion of the first conductive base layer to electrically insulate the contact posts and the first conductor lines;
   (g) removing the second conductive base layer;

(h) disposing a layer of thin flexible electrical insulation upon the exposed surfaces of the laminated first and second cable panels and permitting the contact posts to protrude through the layer to provide electrical access to the flexible cable.

13. An elongated cable having a plurality of electrically conductive closely spaced first conductor lines for interconnecting spaced apart integrated circuits comprising:

(a) an electrically insulating laminate material having a length, a first side and a second side;

(b) a plurality of electrically conductive closely spaced elongated planar first conductor lines embedded within the first side of the laminate material and extending a length less than that of the laminate material length;

(c) at least one electrically conductive elongated second conductor line having a first and a second end, the at least one second conductor line extending a length less than that of the laminate material but greater than that of the first conductor lines and the at least one second conductor line embedded within the second side of the laminate material;

(d) at least a pair of vertical connecting pillars for each second conductor line, each pair having pillars with first and second ends with the first end of one pillar of each pair integrally attached to the first end of the second conductor line and the first end of the other pillar of the pair integrally attached to the second end of the second conductor line, and each pillar extending from the second conductor line through the laminate material so that the pillar second end is flush with the first side of the laminate material;

(e) contact posts of an electrically conductive material integrally attached and extending vertically from the ends of the first conductor lines and from the second ends of the pillars; and (f) a top and a bottom insulating layer, with the top layer covering the first side of the laminate material and the bottom layer covering the second side of the laminate material with the contact posts extending through the top layer and exposed for electrical contact.

14. The elongated cable according to claim 13 wherein the insulate laminate material is flexible.

15. The elongated cable according to claim 14 wherein the at least one electrically conductive elongated second conductor line is a singular generally planar line having a vertical connecting pillar at each end.

16. The elongated cable according to claim 14 wherein the at least one electrically conductive elongated second conductor line is a plurality of conductor lines, each having a vertical connecting pillar at each end.

17. The elongated cable according to claim 14 wherein the distance between the first conductor lines is between 0.004 and 0.008 inches.

18. The elongated cable according to claim 17 wherein the insulate laminate material has a thickness of approximately 0.008 inches.

19. The elongated cable according to claim 17 wherein the material of the first conductor lines, the at least one second conductor line, the connecting pillars and the contact posts is copper.

20. An elongated flexible cable formed by the steps of:

(a) fabricating a first cable panel by depositing upon a first base layer of conductive material having two opposed ends a plurality of raised electrically conductive closely spaced elongated planar first conductor lines of a known length having first and second ends and also depositing upon the first base layer at least a pair of electrically conductive vertical connecting pillars extending above the planar first conductor lines, each of the pillars of a pair positioned near each opposed end of the first base layer and positioned beyond the ends of the first conductor lines;

(b) fabricating a second cable panel by depositing at least one raised electrically conductive elongated planar second conductor line upon a second base layer of conductive material, the second conductor line being of a length at least equal to the distance between opposing pairs of vertical pillars of the first cable panel;

(c) laminating the first cable panel to the second cable panel with a thin flexible laminate insulating material being disposed therebetween with the vertical pillars extending through the laminate to electrically contact opposite ends of the second conductor line;

(d) removing selected areas of the first base layer of conductive material to expose the ends of the first conductor lines and the ends of the vertical pillars;

(e) electrolytically depositing vertical contact posts of conductive material upon the exposed ends of the first conductor lines and the exposed ends of the pillars;

(f) removing the remaining portion of the first conductive base layer to electrically insulate the contact posts and the first conductor lines;

(g) removing the second conductive base layer;

(h) disposing a layer of electrical insulation upon the exposed surfaces of the laminated first and second cable panels and permitting the contact posts to protrude through the layer to provide electrical access to the flexible cable.

* * * * *